US011251392B2

(12) United States Patent
Gu et al.

(10) Patent No.: US 11,251,392 B2
(45) Date of Patent: Feb. 15, 2022

(54) DISPLAY SUBSTRATE AND PREPARATION METHOD THEREOF, DISPLAY DEVICE AND PREPARATION METHOD THEREOF AND DISPLAY APPARATUS

(71) Applicant: BOE TECHNOLOGY GROUP CO., LTD., Beijing (CN)

(72) Inventors: Penghao Gu, Beijing (CN); Chunyan Xie, Beijing (CN); Song Zhang, Beijing (CN); Weifeng Zhou, Beijing (CN); Lingzhi Qian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 52 days.

(21) Appl. No.: 16/588,932

(22) Filed: Sep. 30, 2019

(65) Prior Publication Data
US 2020/0136080 A1    Apr. 30, 2020

(30) Foreign Application Priority Data
Oct. 24, 2018    (CN) .......................... 201811243730.9

(51) Int. Cl.
*H01L 51/52*    (2006.01)
*H01L 51/56*    (2006.01)
(Continued)

(52) U.S. Cl.
CPC ...... *H01L 51/52* (2013.01); *H01L 2251/5338* (2013.01)

(58) Field of Classification Search
CPC .................................................... H01L 51/52
See application file for complete search history.

(56) References Cited

U.S. PATENT DOCUMENTS

2017/0170206 A1\* 6/2017 Lee ................... H01L 29/78633
2020/0203457 A1\* 6/2020 Lim .................... H01L 27/1244

FOREIGN PATENT DOCUMENTS

CN    106340523 A    1/2017
CN    106887447 A    6/2017
(Continued)

OTHER PUBLICATIONS

Chinese Office Action dated Apr. 24, 2020, from application No. 201811243730.9.

*Primary Examiner* — Omar F Mojaddedi
(74) *Attorney, Agent, or Firm* — Thomas | Horstemeyer, LLP

(57) ABSTRACT

A display substrate and a preparation method thereof, a display device and a preparation method thereof and a display apparatus are proposed in the disclosure. The preparation method of the display substrate includes: providing a flexible base, an upper surface thereof having a display area and a circuit connection area, and a portion of the flexible base including a bending portion and a connection portion; disposing a groove on the lower surface, and an orthographic projection of the groove on the upper surface corresponding to a position of an orthographic projection of the bending portion on the upper surface; disposing a back plate, an OLED light emitting device and a package structure in a sequence on the display area, and disposing a circuit connection layer on the circuit connection area. Bending the bending portion downward to extend, the connection portion is located on a side of the lower surface.

19 Claims, 8 Drawing Sheets

(51) Int. Cl.
*H01L 51/00* (2006.01)
*H01L 27/32* (2006.01)
*H01L 27/12* (2006.01)
*H01L 29/786* (2006.01)

(56) References Cited

FOREIGN PATENT DOCUMENTS

| CN | 107195642 A | * | 9/2017 |
| CN | 107742639 A | * | 2/2018 |

* cited by examiner

DISPLAY SUBSTRATE AND PREPARATION METHOD THEREOF, DISPLAY DEVICE AND PREPARATION METHOD THEREOF AND DISPLAY APPARATUS

CROSS REFERENCE

The present application claims the priority to Chinese application No. 201811243730.9, filed on Oct. 24, 2018, which is incorporated herein by reference in its entirety.

TECHNICAL FIELD

The present disclosure relates to the field of the display technology, and in particular, to a display substrate and a preparation method thereof, a display device and a preparation method thereof and a display apparatus.

BACKGROUND

With the development of the display industry, Organic light-emitting diode (OLED) has been widely researched and applied in the industry as a new type of light-emitting device, especially used in current mainstream designs such as full screen and narrow frame etc., and has broad development prospects.

In the narrow frame design of the existing OLED products, the implementation of the narrow frame needs to bend the circuit connection area of the OLED display device to the back surface of the display area, thus the structural size of the circuit connection portion (for example, the "chin" portion of the products such as mobile phone, pad, and display etc.) of the flexible base is smaller. Meanwhile, the back film disposed on the back surface of the OLED display device is required to have a high adhesive force as a protective film material, therefore, during the above described bending process, the back film will generate a larger tensile stress, which directly causes the circuit connection area to be broken or damaged.

SUMMARY

According to one aspect of the present disclosure, a display substrate is provided. In the arrangement, the display substrate includes a flexible base. An upper surface of the flexible base has a display area and a circuit connection area, and a lower surface of the flexible base is provided with a back film. A portion of the flexible base corresponding to the circuit connection area includes a bending portion and a connection portion. The lower surface of the flexible base is provided with a groove, an orthographic projection of the groove on the upper surface of the flexible base corresponds to a position of an orthographic projection of the bending portion on the upper surface of the flexible base.

According to one of the arrangements of the present disclosure, the section of the groove is in a shape of rectangle or trapezoid.

According to one of the arrangements of the present disclosure, the groove includes a plurality of sub-grooves, the plurality of sub-grooves are disposed in parallel and interval, and the section of the groove is in a shape of grid.

According to one of the arrangements of the present disclosure, the groove depth of the groove is one third to one half of a thickness of the flexible base.

According to one of the arrangements of the present disclosure, a width of a notch of the groove is in the range of 0.8 mm to 1.2 mm.

According to one of the arrangements of the present disclosure, the circuit connection area of the upper surface of the flexible base is provided with a circuit connection layer. The circuit connection layer includes a circuit bending portion and a circuit connection portion, a orthographic projection of the circuit bending portion on the upper surface of the flexible base corresponds to a position of an orthographic projection of the bending portion on the upper surface of the flexible base, and the circuit bending portion corresponds to the bending portion and is bent downwardly to extend.

According to one of the arrangements of the present disclosure, the back film is provided with a through groove, an orthographic projection of the through groove on the upper surface of the flexible base corresponding to a position of an orthographic projection of the groove on the upper surface of the flexible base.

According to another aspect of the present disclosure, a display device is provided. In the arrangement, the display device includes the display substrate proposed by the present disclosure and described in the above arrangements. In the arrangement, the bending portion of the flexible base is bent downwardly to extend, and the connection portion is located below a portion of the flexible base corresponding to the display area.

According to another aspect of the present disclosure, a display apparatus is provided. In the arrangement, the display apparatus includes the display device proposed by the present disclosure and described in the above arrangements.

According to another aspect of the present disclosure, a preparation method of a display substrate is provided. The preparation method includes providing a flexible base. An upper surface thereof is provided with a display area and a circuit connection area. A portion of the flexible base corresponding to the circuit connection area includes a bending portion and a connecting portion. The preparation method includes disposing a groove on a lower surface of the flexible base. An orthographic projection of the groove on the upper surface of the flexible base corresponds to a position of an orthographic projection of the bending portion on the upper surface of the flexible base. The preparation method includes disposing a back plate, an OLED light emitting device and a package structure in a sequence on the display area of the upper surface of the flexible base, and disposing a circuit connection layer on the circuit connection area of the upper surface of the flexible base. The preparation method includes bending the bending portion of the flexible base downward to extend. The connection portion is located on a side of the lower surface of the flexible base.

According to one of the arrangements of the present disclosure, the preparation of the flexible base includes providing a substrate, disposing a convex structure on an upper surface of the substrate, coating on the upper surface of the substrate to form the flexible base, and a position of the lower surface of the flexible base corresponding to the convex structure forming the groove, and separating the substrate from the flexible base.

According to one of the arrangements of the present disclosure, the preparation of the flexible base includes providing a substrate, disposing a limiting convex structure on a corner portion of an upper surface of the substrate, coating on the upper surface of the substrate to form the flexible base, and cutting to separate the substrate from the flexible base, and the limiting convex structure being configured to limit an amount of feed of a cutting during the separation process.

According to one of the arrangements of the present disclosure, the preparation of the flexible base includes providing a substrate, disposing a convex structure on an upper surface of the substrate, disposing a limiting convex structure on a corner portion of an upper surface of the substrate, coating on the upper surface of the substrate to form a flexible base, and a position of the lower surface of the flexible base corresponding to the convex structure forming the groove, and cutting to separate the substrate from the flexible base, and the limiting convex structure being configured to limit an amount of feed of a cutting during the separation process.

According to one of the arrangements of the present disclosure, the preparation method of the display substrate further includes disposing a back film on the lower surface of the flexible base and disposing a through groove in the back film, an orthographic projection of the through groove on the upper surface of the flexible base corresponding to a position of an orthographic projection of the groove on the upper surface of the flexible base.

According to one of the arrangements of the present disclosure, using laser to cut the through groove along two straight cutting paths on the back film, and the two straight cutting paths corresponding to groove walls on both sides of the groove, respectively.

According to another aspect of the present disclosure, a preparation method of a display device is provided. The preparation method includes providing a flexible base, an upper surface thereof being provided with a display area and a circuit connection area, and a portion of the flexible base corresponding to the circuit connection area including a bending portion and a connecting portion, disposing a groove at the lower surface of the flexible base, and an orthographic projection of the groove on the upper surface of the flexible base corresponding to a position of an orthographic projection of the bending portion on the upper surface of the flexible base, disposing a back plate, an OLED light emitting device and a package structure in a sequence on the display area of the upper surface of the flexible base, and disposing a circuit connection layer on the circuit connection area of the upper surface of the flexible base, and bending the bending portion of the flexible base downward to extend, and the connection portion being located below a portion of the flexible base corresponding to the display area.

DETAILED DESCRIPTION

Typical arrangements embodying features of the present disclosure will be described in detail in the following description. It should be understood that the present disclosure is capable of having various modifications in different arrangements, which all do not depart from the scope of the present disclosure, and the description and accompanying drawings thereof are to be regarded as illustrative in essence rather than limiting the present disclosure.

In the following description of different example arrangements of the present disclosure, reference is made to the accompanying drawings, the accompanying drawings forms a part of the present disclosure, and among them, different example structures, systems, and operations that can achieve a plurality of aspects of the present disclosure are shown by way of example. It should be understood that other particular solutions of the components, the structures, the example apparatuses, the systems and the operations can be used, and structural and functional modifications can be made without departing from the scope of the present disclosure. Moreover, although the terms "above", "between", "inside", "side" and etc., may be used in the present specification to describe different example features and elements of the present disclosure, these terms are used herein for convenience only, and such as in accordance with the directions of the examples described in the accompanying drawings. Nothing in the present specification should be understood as requiring a particular three-dimensional direction of the structure to fall within the scope of the present disclosure.

Figure 1:
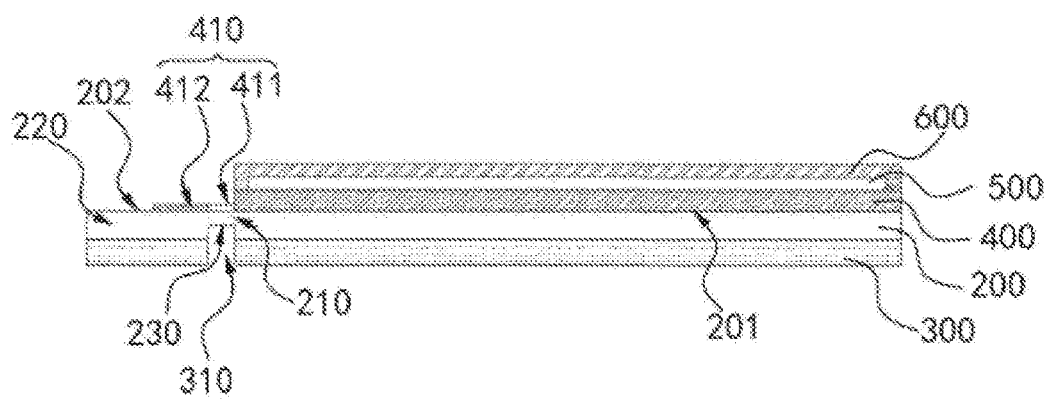
FIG. 1 is a layered view of a display substrate according to an example arrangement.

Referring to FIG. 1, a layered view of a display substrate proposed by the present disclosure is representatively shown. In the example arrangement, the display substrate proposed by the present disclosure is described by taking a display apparatus such as applied to a mobile phone, a pad, or a display as an example. Those skilled in the art will readily understand that, in order to apply the related design of the present disclosure to other types of display devices or other fields, various modifications, additions, substitutions, deletions or other changes are made to the specific arrangements described below, and these variations are still within the scope of the principle of the display substrate proposed by the present disclosure.

As shown in FIG. 1, in the present arrangement, the display substrate proposed by the present disclosure mainly includes a flexible base 200, a back film 300, a back plate 400, an OLED light emitting device 500 and a package structure 600. Hereinafter, the laminated structure, the connection type and the functional relationship of each main constituent part of the display substrate proposed by the present disclosure will be described in detail in conjunction with the above described accompanying drawings.

As shown in FIG. 1, in the present arrangement, the upper surface of the flexible base 200 is divided into a display area 201 and a circuit connection area 202, and the display area 201 and the circuit connection area 202 may also correspond to the display portion and the circuit connection portion 412 of the display substrate. The lower surface of the flexible base 200 is provided with a back film 300. The display area 201 of the upper surface of the flexible base 200 is sequentially stacked with a back plate 400, an OLED light emitting device 500 and a package structure 600. That is, the back plate 400 is disposed on the upper surface of the flexible base 200, the OLED light emitting device 500 is disposed on the back plate 400, and the package structure 600 is disposed on the OLED light emitting device 500. A portion of the flexible base 200 corresponding to the circuit connection area 202 is further divided into a bending portion 210 and a connection portion 220. The lower surface of the flexible base 200 is provided with a groove 230, and the orthographic projection of the groove 230 on the upper surface of the flexible base 200 corresponds to the position of the orthographic projection of the bending portion 210 on the upper surface of the flexible base 200.

Through the above described design of the present disclosure, the groove 230 can reduce the stress of the structure and make the bending process easier during the bending process of the display substrate. Meanwhile, due to the dispose of the groove 230, a portion of the back film 300 corresponding to the groove 230 is not bonded with the lower surface of the flexible base 200, so that the removal of the portion of the back film 300 is easier.

It should be noted that the definitions of the upper surface and the lower surface of the flexible base 200 are merely example and do not limit various inversions or variations of the flexible base 200 in space. In the arrangement, a preparation process for forming the flexible base 200 by coating on the substrate 700 is taken as an example, that is, a side surface of the flexible base 200 facing the substrate 700 may be defined as a lower surface, and a side surface of the flexible base 200 facing away from the substrate 700 may be defined as an upper surface.

As shown in FIG. 1, in the present arrangement, the circuit connection area 202 of the upper surface of the flexible base 200 is further provided with a circuit connection layer 410. Specifically to say, the back plate 400 mainly includes a blocking layer, an insulating layer, a gate electrode, a metal electrode and the like. The circuit connection layer 410 is connected with the gate electrode and the metal electrode etc., and the circuit connection layer 410 mainly includes the circuit bending portion 411 and the circuit connection portion 412. The orthographic projection of the circuit bending portion 411 on the upper surface of the flexible base 200 corresponds to the position of the orthographic projection of the bending portion 210 on the upper surface of the flexible base 200. The orthographic projection of the circuit connection portion 412 on the upper surface of the flexible base 200 at least partly corresponds to the position of the orthographic projection of the connection portion 220 on the upper surface of the flexible base 200.

In the present arrangement, the width of the groove 230 (the width of the notch and the width of the groove bottom) is substantially equal to the width of the bending portion 210 of the flexible base 200, that is, substantially equal to the width of the circuit bending portion 411 of the circuit connection layer 410. In addition, the width of the through groove 310 disposed in the back film 300 is the same with the width of the notch of the groove 230. In other arrangements, the width of the groove 230 may also be slightly larger or slightly smaller than the width of the bending portion 210 or the circuit bending portion 411, and the orthographic projection of the groove 230 on the upper surface of the flexible base 200 corresponds to the position of the orthographic projection of the bending portion 210 or the circuit bending portion 411 on the upper surface of the flexible base 200.

Further, as shown in FIG. 1, in the present arrangement, the section of the groove 230 may be a rectangle. In other arrangement, the groove 230 may also adopt other section shape or other structural design, such as a trapezoidal section or a grid shape section etc., etc., which will be exemplified to describe in the following arrangements, and will not be described here.

Further, in the present arrangement, the groove depth of the groove 230 may be designed to be one third to one half of the thickness of the flexible base 200. Accordingly, the present disclosure can further optimize the structural strength of the bending portion 210 (i.e., the remaining structure after the portion of the flexible base 200 is removed from the groove 230) of the flexible base 200 while providing the above described effects of reducing structural stress, reducing bending difficulty and the like. In other arrangement, the groove depth of the groove 230 may also adopt other design, for example, the groove depth is less than one third of the thickness of the flexible base 200 or more than one half of the thickness of the flexible base 200, which is not limited to the arrangement.

Further, in the present arrangement, the notch width of the groove 230 may be designed to be 0.8 mm to 1.2 mm. In other arrangement, the notch width of the groove 230 may also adopt other design, for example, is less than 0.8 mm or more than 1.2 mm, and can be flexibly adjusted according to the size of the relevant structure (for example, the bending portion 210 of the flexible base 200 or the circuit bending portion 411 of the circuit connection layer 410), which is not limited to the present arrangement.

In addition, based on the design of the groove 230 having a rectangular section, in the present arrangement, the width of the notch of the groove 230 is the width of the groove bottom of the groove 230. In other arrangement, when the section of the groove 230 adopts other design shape, the above described design of the notch width of the groove 230 (for example, 0.8 mm to 1.2 mm) can also be understood as the groove bottom width of the groove 230 or the average width of the groove 230, which is not limited to the notch width of the groove 230.

Further, as shown in FIG. 1, in the present arrangement, the back film is provided with a through groove 310. In the arrangement, the orthographic projection of the through groove 310 on the upper surface of the flexible base 200 corresponds to the position of the orthographic projection of the groove 230 on the upper surface of the flexible base 200. Accordingly, the present disclosure can adopt a simpler and more accurate process, such as a laser cutting along a straight path etc., when the back film 300 is removed the portion for disposing the through groove 310.

Figure 2:
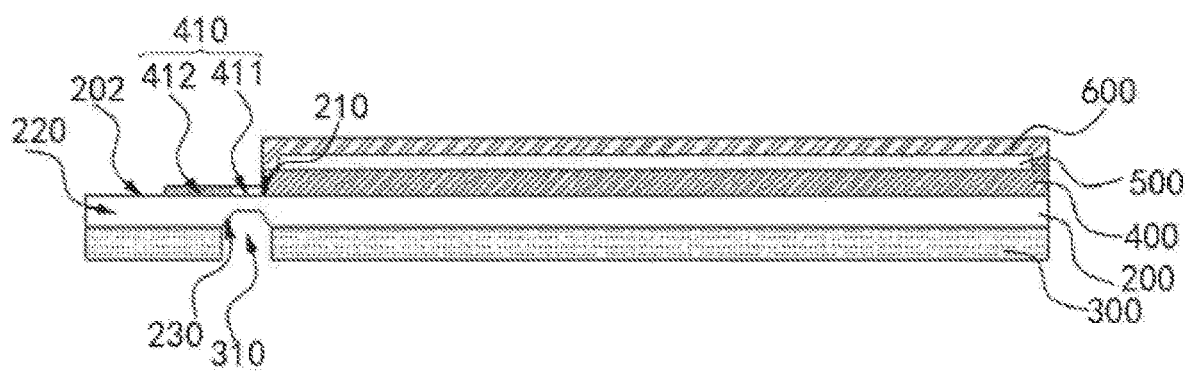
FIG. 2 is a layered view of a display substrate according to another example arrangement.

Referring to FIG. 2, a layered view of another arrangement of a display substrate capable of embodying the principle of the present disclosure is representatively shown in FIG. 2. In the example arrangement, the design of the display substrate proposed by the present disclosure is substantially the same with that of the first arrangement described above, and the main design differences thereof will be described below.

As shown in FIG. 2, in the present arrangement, the section of the groove 230 disposed on the lower surface of the flexible base 200 is a substantial trapezia. Specifically to say, the upper bottom of the trapezia corresponding to the section of the groove 230 (i.e., the shorter one of the two bottom sides of the trapezia) corresponds to the groove bottom of the groove 230, the lower bottom of the trapezia (i.e., the longer one of the two bottom sides of the trapezia) corresponds to the notch of the groove 230, and the two side edges of the trapezia correspond to the groove walls on both sides of the groove 230, respectively.

Figure 5:
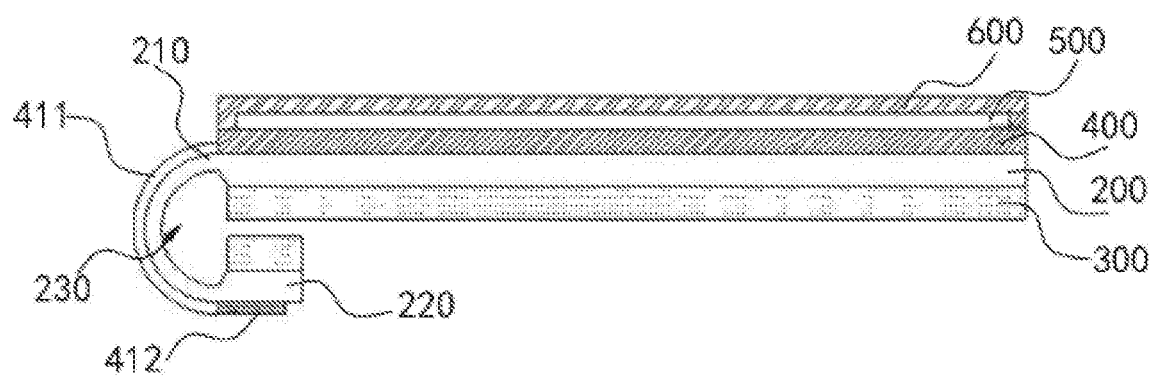
FIG. 5 is a layered view of a display device according to another example arrangement.

Further, as shown in FIG. 5, in the present arrangement, the width of the groove bottom of the groove 230 may be substantially equal with the width of the bending portion 210 of the flexible base 200 or the circuit bending portion 411 of the circuit connection layer 410. In other arrangements, based on the design of the groove 230 having a trapezoidal section, the width of the groove bottom of the groove 230 may also be slightly larger or slightly smaller than the width of the bending portion 210 and the circuit bending portion 411. Alternatively, the width of the notch of the groove 230 may also be substantially equal to the width of the bending portion 210 and the circuit bending portion 411, and alternatively, the width of the notch of the recess 230 may be slightly larger or slightly smaller than the width of the bending portion 210 and the circuit bending portion 411.

Further, as shown in FIG. 5, in the present arrangement, the section of the groove 230 may be an isosceles trapezia, that is, the groove walls on both sides of the groove 230 may adopt a symmetrical design. Through the above described design, the force on the structure of both sides of the groove 230 having an isosceles trapezoidal section is more balanced during the bending process, and the bending effect is better. In other arrangement, the section of the groove 230 may also adopt a right-angled trapezia or an irregular trapezia or the like, and is not limited to the arrangement.

Figure 3:
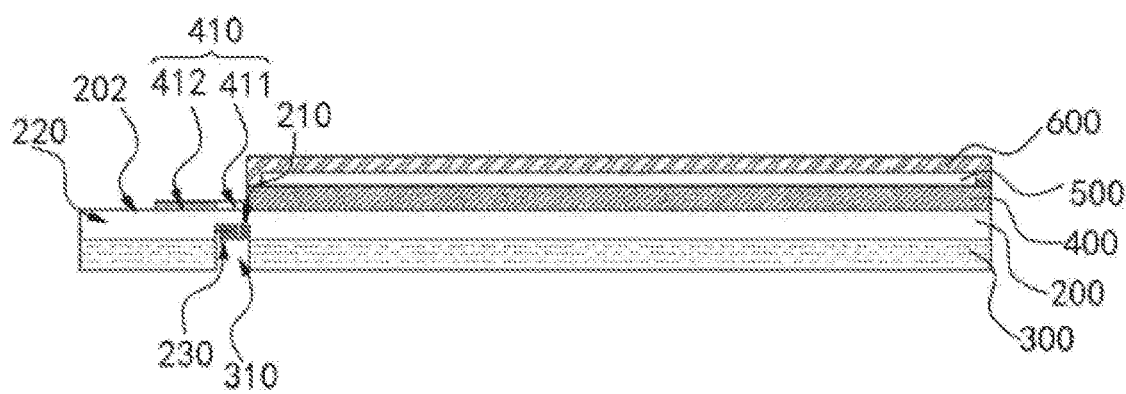
FIG. 3 is a layered view of a display substrate according to another example arrangement.

Referring to FIG. 3, a layered view of another arrangement of a display substrate capable of embodying the principle of the present disclosure is representatively shown in FIG. 3. In the example arrangement, the design of the display substrate proposed by the present disclosure is substantially the same with that of the two arrangements described above, and the main design differences thereof will be described below.

As shown in FIG. 3, in the present arrangement, the section of the groove 230 disposed on the lower surface of the flexible base 200 is a substantial grid shape. Specifically to say, the groove 230 is formed together by a plurality of sub-grooves 230 arranged in parallel and interval.

Further, as shown in FIG. 3, in the present arrangement, the sub-groove 230 has a substantially rectangular section. Accordingly, after the groove 230 are bent, the plurality of sub-grooves 230 form a zigzag structure arranged along the bending path (see FIG. 6). In addition, each sub-groove 230 may have the same shape and size. In other arrangement, the section of the sub-groove 230 may also select other shape, such as trapezia or triangle etc., and the shape of each sub-groove 230 is not limited to the same.

Further, in the present arrangement, the structure defining the notch of each sub-groove 230 is concaved a gap with respect to the lower surface of the flexible base 200, so that when the back film 300 is disposed on the lower surface of the flexible base 200, it does not adhere to the structure defining the notches of the sub-grooves 230, which facilitate the removal of the portion of the back film 300.

It should be noted here that the display substrate shown in the accompanying drawings and described in present specification is only a few examples of the many types of display substrates that can adopt the principle of the present disclosure. It should be clearly understood that the principle of the present disclosure are in no way limited to any detail of the display substrate or any component of the display substrate shown in the accompanying drawings or described in the present specification.

Figure 4:
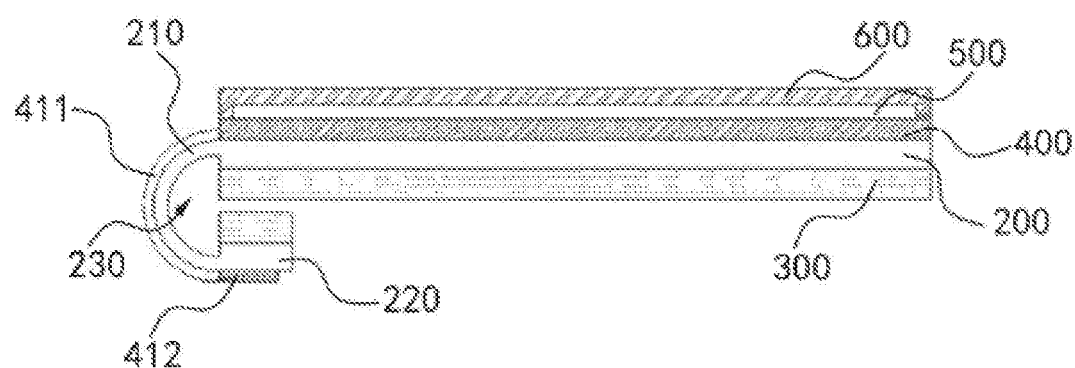
FIG. 4 is a layered view of a display device according to an example arrangement.

Referring to FIG. 4, a layered view of a display device proposed by the present disclosure is representatively shown, and a layered view of a display device based on the display substrate shown in FIG. 1 is specifically shown. In one example arrangement, the display device proposed by the present disclosure is described by applying to a display apparatus such as a mobile phone, a pad, or a display as an example. Those skilled in the art will readily understand that, in order to apply the related design of the present disclosure to other type of display device or other field, various modifications, additions, substitutions, deletions or other changes are made to the specific arrangements described below, and these variations are still within the scope of the principle of the display device proposed by the present disclosure.

As shown in FIG. 4, in the present arrangement, the display device proposed by the present disclosure mainly includes the display substrate proposed by the present disclosure and described in detail in the above described arrangements. The display substrate mainly includes a flexible base 200, a back film 300, a back plate 400, an OLED light emitting device 500 and a package structure 600.

As shown in FIG. 4, in the present arrangement, the bending portion 210 of the flexible base 200 of the display substrate can be bent downward to extend to position the connection portion 210 below the portion of the flexible base 200 corresponding to the display area 201, thus forming a bending connection structure of the display device.

In addition, as shown in FIG. 4, in the present arrangement, the circuit bending portion 411 of the circuit connection layer 410 is bent downward to extend together with the bending portion 210 during the bending process of the flexible base 200. The circuit connection portion 412 of the circuit connection layer 410 is located on the lower surface side of the flexible base 200 together with the connection portion 220 after the flexible base 200 is bending, thus let the circuit connection portion 412 locate below the portion of the flexible base 200 corresponding to the display area 201.

Referring to FIG. 5, a layered view of another arrangement of the display device proposed by the present disclosure is representatively shown, and a layered view of a display device based on the display substrate shown in FIG. 2 is specifically shown. In the example arrangement, the design of the display device proposed by the present disclosure is substantially the same with that of the above arrangement described above, and the main design differences thereof will be described below.

As shown in FIG. 5, in the present arrangement, the display device includes the display substrate shown in FIG. 2. Specifically to say, the groove 230 disposed on the lower surface of the flexible base 200 has a substantially trapezia section. The upper bottom of the trapezia corresponding to the section of the groove 230 (i.e., the shorter one of the two bottom sides of the trapezia) corresponds to the groove bottom of the groove 230, the lower bottom of the trapezia (i.e., the longer one of the two bottom sides of the trapezia) corresponds to the notch of the groove 230, and the two side edges of the trapezia correspond to the groove walls on both sides of the groove 230, respectively.

Figure 6:
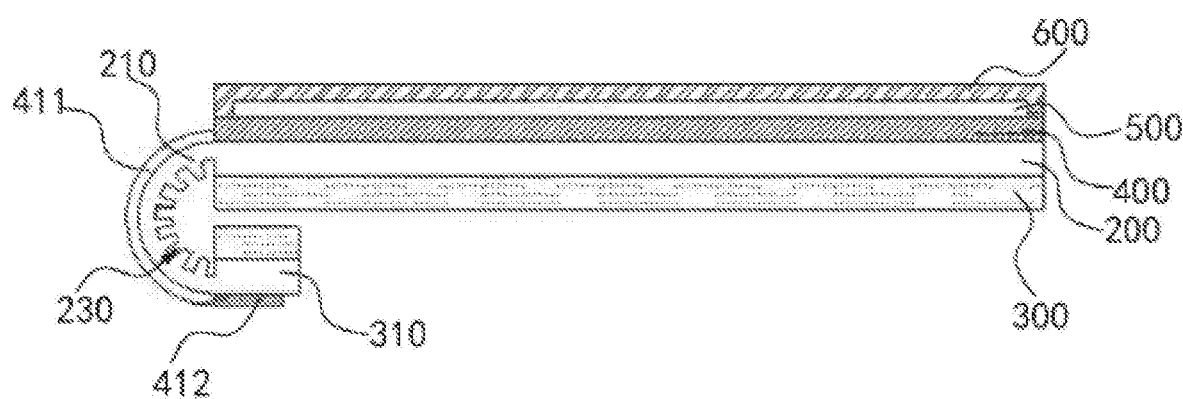
FIG. 6 is a layered view of a display device according to another example arrangement.

Referring to FIG. 6, a layered view of another arrangement of the display device proposed by the present disclosure is representatively shown, and a layered view of a display device based on the display substrate shown in FIG. 3 is specifically shown. In the example arrangement, the design of the display device proposed by the present disclosure is substantially the same with that of the two arrangements described above, and the main design differences thereof will be described below.

As shown in FIG. 6, in the present arrangement, the section of the groove 260 disposed on the lower surface of the flexible base 200 is a substantial grid shape. Specifically to say, the groove 230 is formed together by a plurality of sub-grooves 230 arranged in parallel and interval. After the groove 230 is bending, the plurality of sub-grooves 230 form a zigzag structure arranged along the bending path. In addition, each sub-groove 230 has the same shape and size. In other arrangement, the section of the sub-groove 230 may also select other shape, such as trapezia or triangle etc., and the shape of each sub-groove 230 is not limited to the same.

It should be noted here that the display device shown in the accompanying drawings and described in present specification is only a few examples of the many types of display devices that can adopt the principle of the present disclosure. It should be clearly understood that the principle of the present disclosure are in no way limited to any detail of the display device or any component of the display device shown in the accompanying drawings or described in the present specification.

Based on the above detailed description of several example arrangements of the display substrate and the display device proposed by the present disclosure, the display apparatus proposed by the present disclosure will be described below.

In the present arrangement, the display apparatus proposed by the present disclosure mainly includes the display substrate proposed by the present disclosure and described in detail in the above described arrangements. In the arrangement, the display apparatus may be, for example, a mobile phone, a pad, a display, a television or the like.

It should be noted here that the display apparatus shown in the accompanying drawings and described in the present specification is only a few examples of the many types of display apparatus that can adopt the principle of the present disclosure. It should be clearly understood that the principle of the present disclosure are in no way limited to any detail of the display apparatus or any component of the display apparatus shown in the accompanying drawings or described in the present specification.

Based on the above detailed description of several example arrangements of the display substrate proposed by the present disclosure, the preparation method for the display substrate proposed by the present disclosure will be described below. In the present arrangement, the preparation method for the display substrate proposed by the present disclosure is described by taking preparation for display substrate as an example. Those skilled in the art will readily understand that, in order to apply the related design of the present disclosure to other devices or other process, various modifications, additions, substitutions, deletions or other changes are made to the specific arrangements described below, and these variations are still within the scope of the principle of the preparation method for the display substrate proposed by the present disclosure.

Referring to FIG. 7 to FIG. 18, each of the accompanying drawings representatively shows a layered or top view of different operations or different arrangements when preparing a display substrate by adopting a preparation method of a display substrate in accordance with the principle of the present disclosure. As shown in FIG. 7 to FIG. 18, in the present arrangement, the preparation method of the display substrate proposed by the present disclosure at least includes the following operations:

Providing a flexible base 200, an upper surface thereof having a display area 201 and a circuit connection area 202, and a portion of the flexible base 200 corresponding to the circuit connection area 202 includes a bending portion 210 and a connection portion 220;

The lower surface of the flexible base 200 is provided with a groove 230, and the orthographic projection of the groove 230 on the upper surface of the flexible base 200 corresponds to the position of the orthographic projection of the bending portion 210 on the upper surface of the flexible base 200.

The back plate 400, the OLED light emitting device 500 and the package structure 600 are sequentially disposed on the display area 201 of the upper surface of the flexible base 200, and the circuit connection layer 410 is disposed on the circuit connection area 202 of the upper surface of the flexible base 200.

So far, the key operations of the preparation method of a display substrate proposed by the present disclosure are roughly summarized as above. Each operation of the preparation method for the display substrate will be specifically described below with reference to the accompanying drawings, and the example processes of a part of operations and other example operations of the preparation method will be described in detail.

Figure 7:
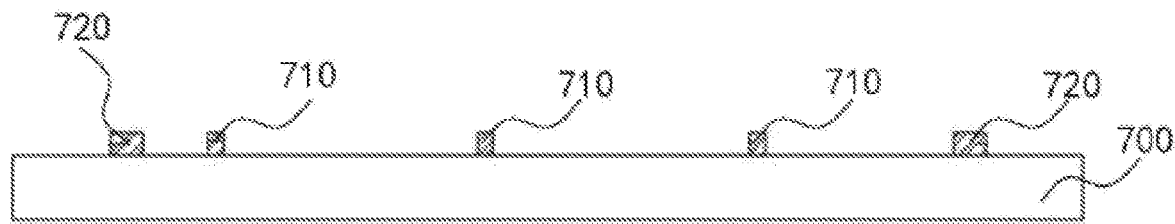
FIG. 7 is a layered view of an operation in a preparation method of a display substrate according to an example arrangement.
Figure 10:
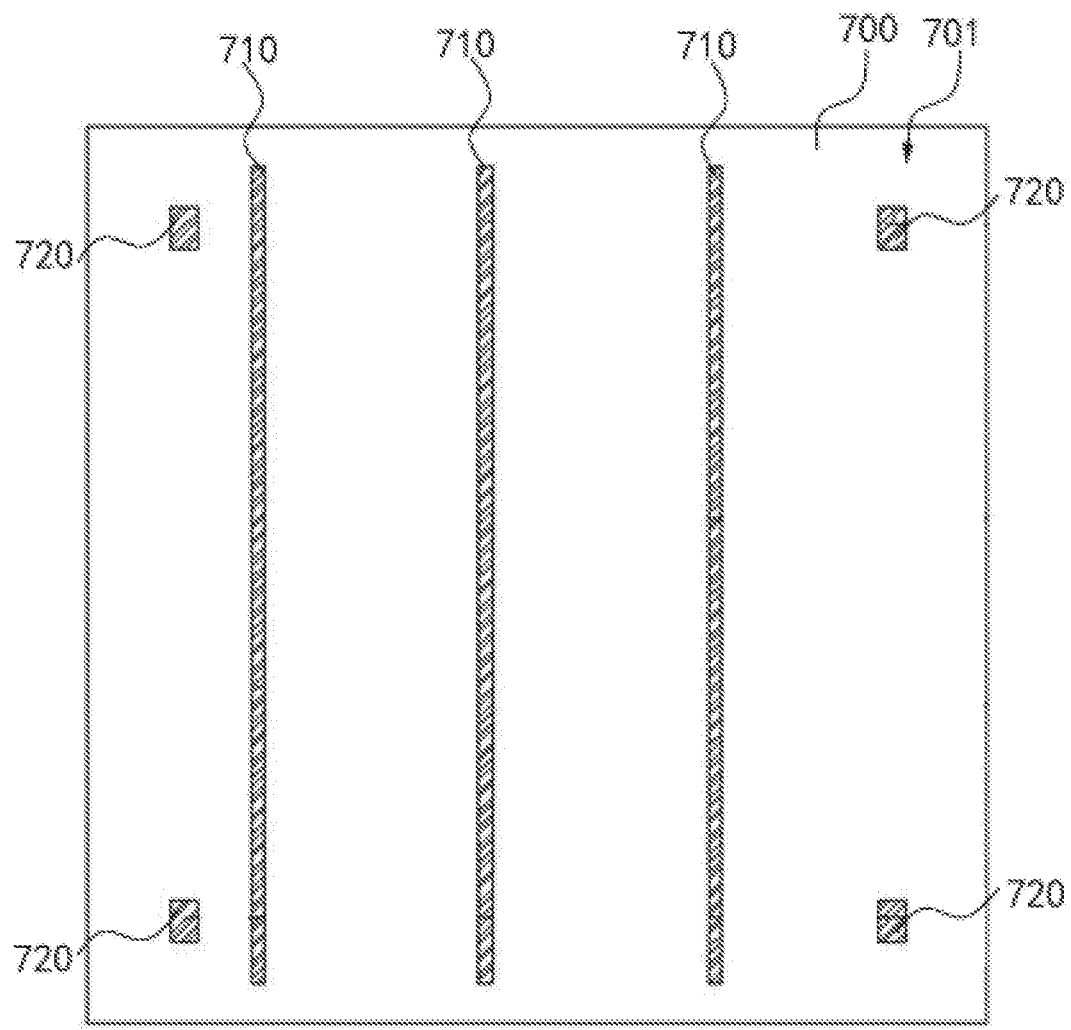
FIG. 10 is a top view of an operation in a preparation method of a display substrate shown in FIG. 7.

As shown in FIG. 7 and FIG. 10, in the present arrangement, for the operation of providing the flexible base 200, the flexible base 200 can be prepared on a substrate 700. In the arrangement, the preparation of the flexible base 200 mainly includes the following operations:

Providing a substrate 700;

Disposing a convex structure 710 on the upper surface of the substrate 700;

Coating on the upper surface of the substrate 700 to form a flexible base 200, and the position of the lower surface of the flexible base 200 corresponding to the convex structure 710 forms the groove 230; and Separating the substrate 700 from the flexible base 200.

Specifically to say, as shown in FIG. 7 and FIG. 10, in the present arrangement, a substrate 700 such as a supporting glass for preparing a flexible display device in a related process may be provided. A patterned coating is prepared on the substrate 700, that is, a convex structure 710 is formed. In the arrangement, the number of the convex structures 710 disposed on the substrate 700 may be one or more, the number of the convex structures 710 is equal to the number of display cells to be prepared for the substrate 700, the arrangement of each convex structure 710 corresponds to the Bending area (i.e., the circuit connection area 202 of the flexible base 200) of each display unit, and the length of the convex structure 710 substantially extends through the substrate 700.

Further, in the present arrangement, for the operation of disposing the convex structure 710, the height of the convex structure 710 may be disposed to be one third to one half of the thickness of the flexible base 200 to be prepared. Accordingly, the present disclosure can further optimize the structural strength of the bending portion 210 (i.e., the remaining structure after the portion corresponding to the groove 230 of the flexible substrate is removed) of the flexible base 200. In other arrangement, the height of the convex structure 710 may adopt other design, for example, the height of the convex structure 70 is less than one third of the thickness of the flexible base 200 or more than one half of the thickness of the flexible base 200, which is not limited to the arrangement.

Further, in the present arrangement, for the operation of disposing the convex structure 710, the convex structure 710 may be formed by adopting a silicon oxide coating (SiOx, that is, similar to quartz glass), the silicon oxide coating may be intimately bonded to the substrate 700 to form a patterned distributed convex structure 710 on the substrate 700. In addition, the convex structure 710 can be prepared by adopting Mask or CVD deposition under other process. Accordingly, the convex structure 710 formed by adopting the above described process can provide a function of high temperature resistance and transmission of UV ultraviolet light.

Figure 8:
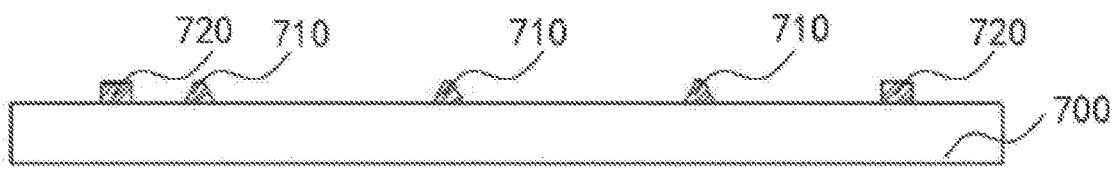
FIG. 8 is a layered view of an operation in a preparation method of a display substrate according to another example arrangement.
Figure 9:
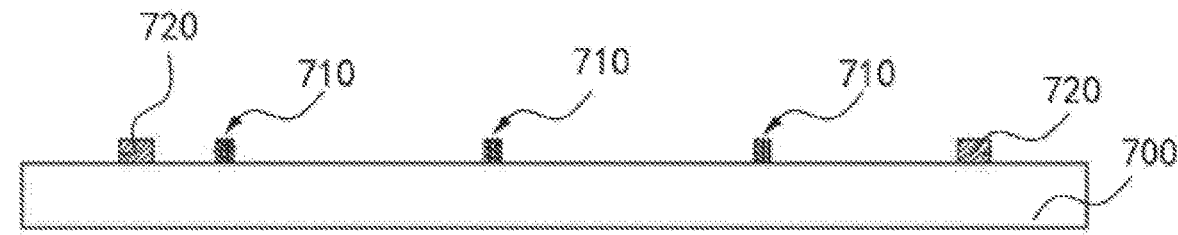
FIG. 9 is a layered view of an operation in a preparation method of a display substrate according to another example arrangement.

Further, as shown in FIG. 7, in the present arrangement, for the operation of disposing the convex structure 710, the section shape of the convex structure 710 may be a rectangle, that is, the section of the groove 230 of the flexible base 200 formed through the convex structure 710 has a rectangular section. In other arrangements, the section shape of the convex structure 710 is not limited to the above described design. For example, as shown in FIG. 8, in another arrangement, the section of the convex structure 710 can also be trapezia. For another example, as shown in FIG. 9, in another arrangement, the section of the convex structure 710 may also be a grid shape.

Figure 11:
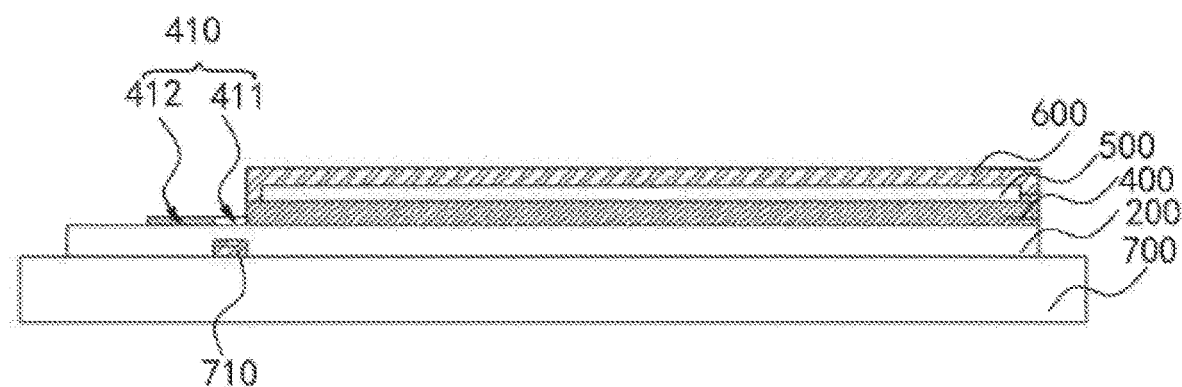
FIG. 11 is a layered view of another operation in a preparation method of a display substrate shown in FIG. 7.
Figure 14:
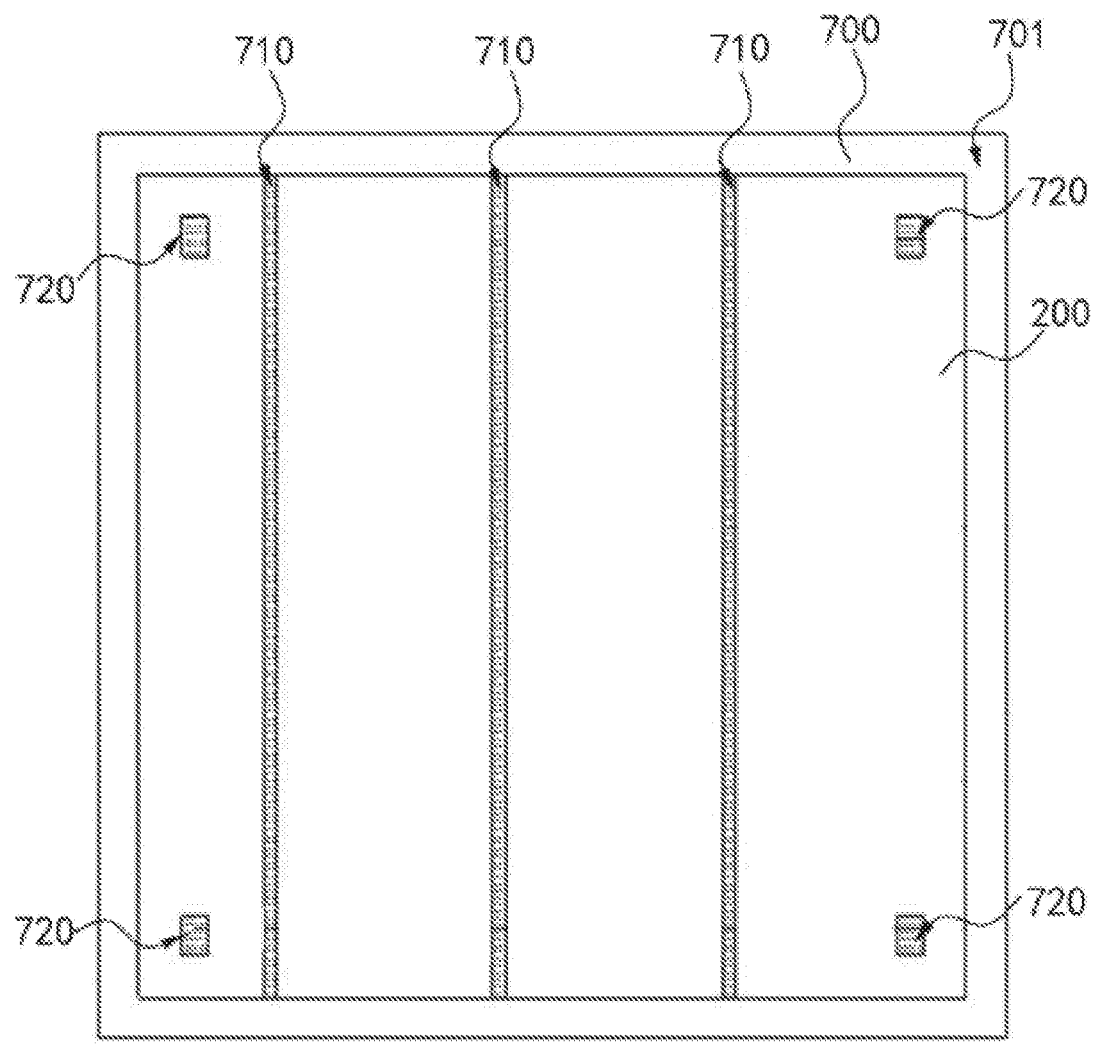
FIG. 14 is a top view of another operation in a preparation method of a display substrate shown in FIG. 11.

As shown in FIG. 11 and FIG. 14, in the present arrangement, for the operation of coating on the substrate 700 to form the flexible base 200, a PI material (i.e., polyimide) is coated on the substrate 700 by adopting the manner of wire coating or hot pressing. In the arrangement, the convex structure 710 disposed on the substrate 700 may throughout the flexible base 200 coated on the substrate 700. Accordingly, the portion of the flexible base 200 coated on the convex structure 710 forms the groove 230. When the lower surface of the flexible base 200 is attached with the back film 300, air can be retained at the groove 230 to form an unbounded area of the back film 300 through the shape of the groove 230, so that the remove of the portion of the back film 300 is more convenient and easier.

Figure 12:
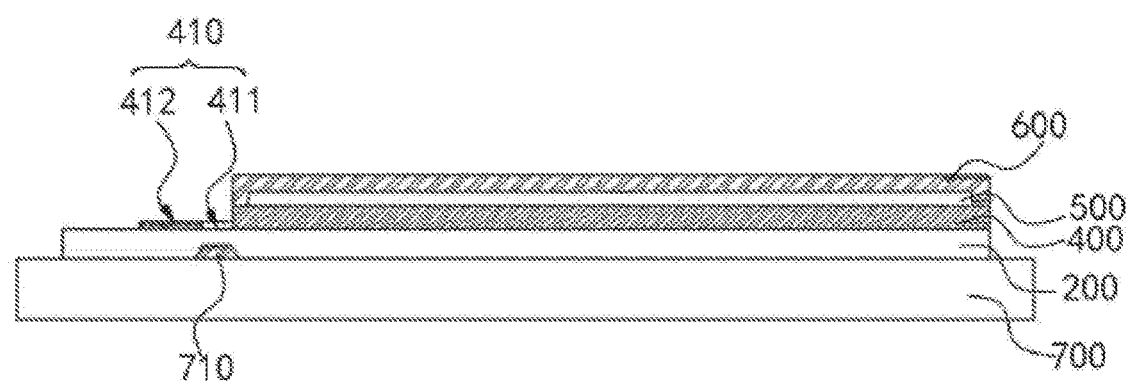
FIG. 12 is a layered view of another operation in a preparation method of a display substrate shown in FIG. 8.
Figure 13:
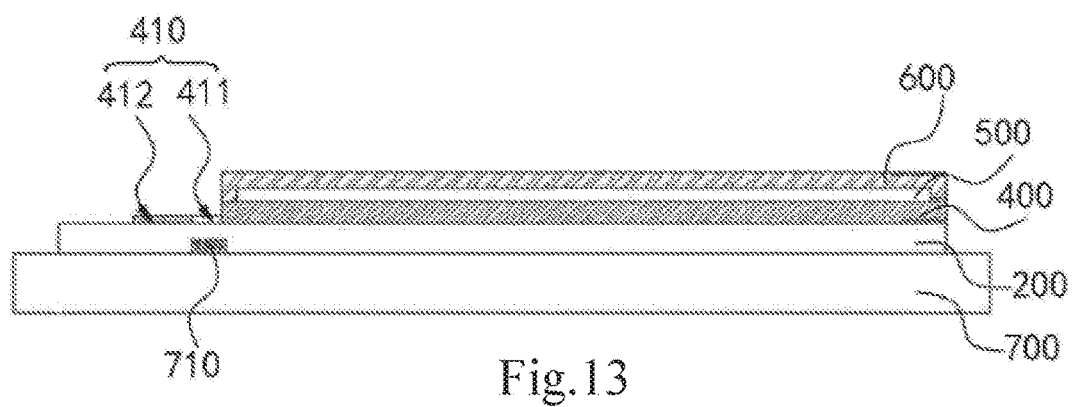
FIG. 13 is a layered view of another operation in a preparation method of a display substrate shown in FIG. 9.

As shown in FIG. 12, in another arrangement, when the section of the convex structure 710 is trapezia, the groove 230 of the flexible base 200 has a trapezoidal section. As shown in FIG. 13, in another arrangement, when the section of the convex structure 710 is a grid shape, the section of the groove 230 of the flexible base 200 is a grid shape and the groove 230 includes a plurality of sub-grooves 230 arranged in parallel and interval, so that the portion of the lower surface of the flexible base 200 corresponding to the bending portion 210 has a larger roughness and is uneven, to form a grid shape, continuous undulating and uneven structure, therefore, when the position corresponding to the groove 230 with grid shape section is attached to the back film 300, since the effective area of the adhesive is smaller to make the adhesive force is smaller, the back film 300 at the above described position can be easily cut and removed.

In the present arrangement, the operation of separating the substrate 700 from the flexible base 200 can be achieved by adopting the manner of LLO laser peeling. Specifically to say, the peeling blade can be inserted into the joint between the edge of the flexible base 200 and the substrate 700 to perform edge separation.

Further, referring to FIG. 7, FIG. 10 and FIG. 14 again, in the present arrangement, the preparation of the flexible base 200 may further include the following operations:

providing a substrate 700;

disposing a convex structure 710 on the upper surface of the substrate 700;

disposing a limiting convex structure 720 on the corner portion 701 of the upper surface of the substrate 700 when disposing the convex structure 710;

coating on the upper surface of the substrate 700 to form a flexible base 200, and the position of the lower surface of the flexible base 200 corresponding to the convex structure 710 forms the groove 230;

cutting to separate the substrate 700 from the flexible base 200, and the limiting convex structure 720 is configured to limit the amount of feed of the cutting during the separation process.

Specifically to say, as shown in FIG. 7, FIG. 10 and FIG. 14, in the present arrangement, since the four corner portions 701 of the substrate 700 are provided with the limiting convex structure 720, which can serve as the end points of the amount of feed of the peeling blade when the substrate 700 is separated from the flexible base 200. That is, when the peeling blade enters into the flexible base 200, the peeling blade stop when touching against the limiting convex structure 720, thus using the limiting convex structure 720 to define the amount of feed, which eliminating the need for process debugging.

Further, in the present arrangement, in the operation of disposing the limiting convex structure 720, the height of the limiting convex structure 720 may also be disposed to be one third to one half of the thickness of the flexible base 200 to be prepared. Moreover, the height of the limiting convex structure 720 is not directly related to the height of the convex structure 710, and the height of them may be the same or different.

Further, in the present arrangement, for the operation of disposing the limiting convex structure 720, the limiting convex structure 720 may be formed by adopting a silicon oxide coating, the silicon oxide coating may be intimately bonded with the substrate 700 to form a limiting convex structure 720 on the corner portion 701 of the substrate 700. In addition, the limiting convex structures 720 can be prepared by adopting Mask or CVD deposition under other process. Moreover, the forming processes of the limiting convex structure 720 and the convex structure 710 have no directly relation, which may be the same or different.

Further, in the present arrangement, the limiting convex structure 720 is 7 mm to 10 mm from the edge of the flexible base 200, and the specific distance may be determined according to the amount of feed when the substrate 700 and the flexible base 200 are subsequently separated.

It should be noted that, in other arrangements, the convex structure 710 and the limiting convex structure 720 are not limited to being disposed at the same time. Taking an example to say, when the groove 230 of the flexible base 200 is formed by adopting other process that do not use the convex structure 710, that is, the groove 230 is formed after the flexible base 200 is separated from the substrate 700, the preparation of the flexible base 200 based on the substrate 700 may at least further include the following operations:

provide a substrate 700;

disposing a limiting convex structure 720 on the corner portion 701 of the upper surface of the substrate 700;

coating on the upper surface of the substrate 700 to form a flexible base 200;

cutting to separate the substrate 700 from the flexible base 200, and the limiting convex structure 720 is configured to limit the amount of feed of the cutting during the separation process.

As shown in FIG. 15 to FIG. 18, in the present arrangement, the preparation method of the display substrate proposed by the present disclosure further includes the following operations:

disposing a back film 300 on the lower surface of the flexible base 200; and disposing a through groove 310 in the back film 300, and the orthographic projection of the through groove 310 on the upper surface of the flexible base 200 corresponds to the position of the orthographic projection of the groove 230 on the upper surface of the flexible base 200.

Figure 15:
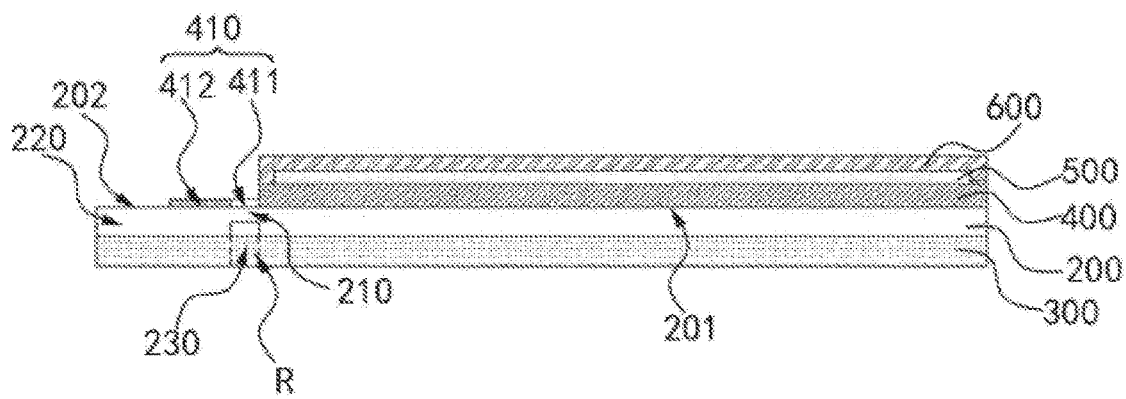
FIG. 15 is a layered view of another operation in a preparation method of a display substrate shown in FIG. 7.
Figure 18:
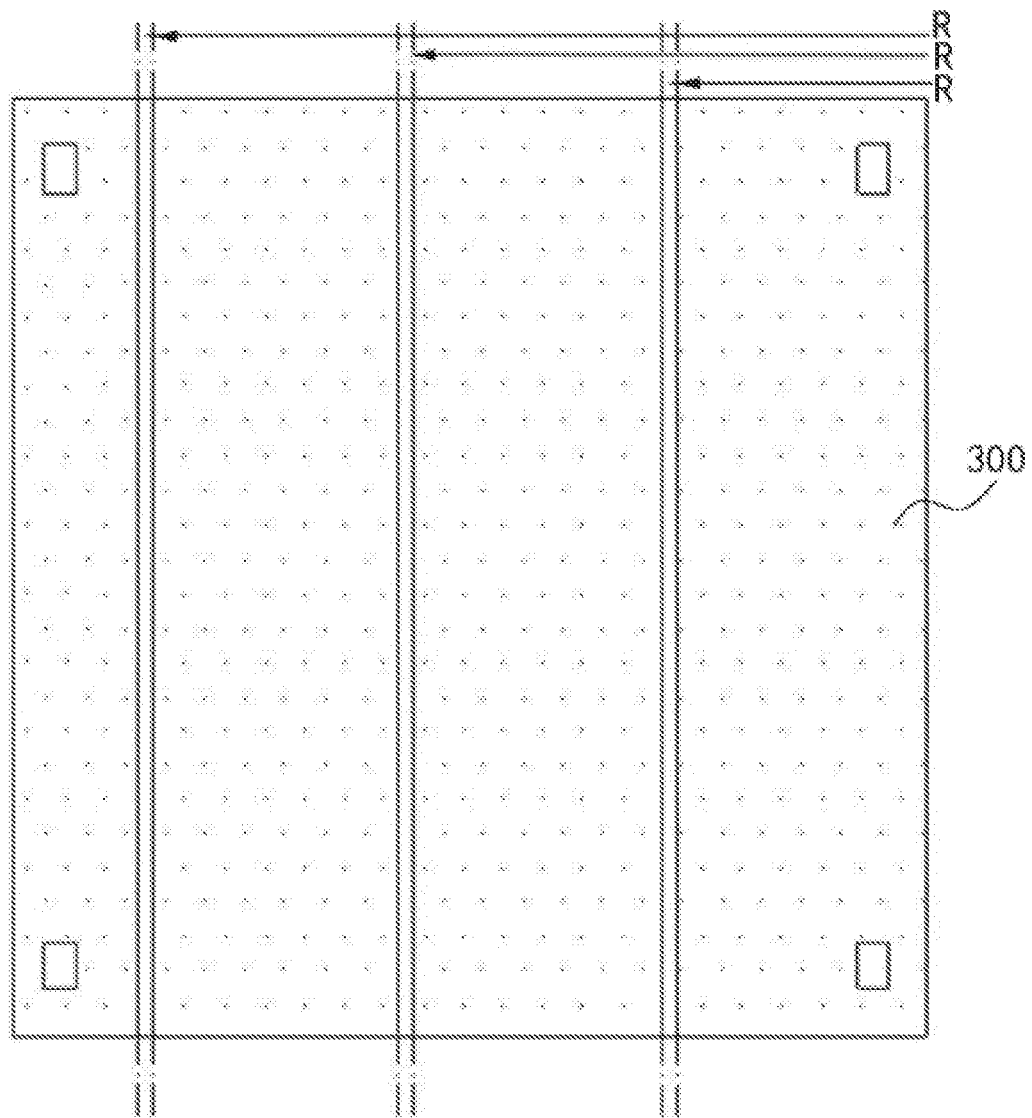
FIG. 18 is a bottom view of another operation in a preparation method of a display substrate shown in FIG. 15.

As shown in FIG. 15 and FIG. 18, in the present arrangement, after the flexible base 200 is separated from the substrate 700, the back film 300 is attached to the lower surface of the flexible base 200. In the arrangement, the groove 230 on the lower surface of the flexible base 200 is not bonded with the back film 300.

As shown in FIG. 15 and FIG. 18, in the present arrangement, for the operation of disposing the through groove 310 on the back film 300, the disposing of the through groove 310 mainly includes the following operations:

using laser to cut the through groove 310 along the two straight cutting paths R on the back film 300, and the two straight cutting paths R correspond to the groove walls on both sides of the grooves 230, respectively.

Specifically to say, as shown in FIG. 15 and FIG. 18, in the present arrangement, the back film 300 may be partially removed to form the through groove 310 by the combined of laser cutting and tearing, thus the back surface tension of the bending area is reduced, and the damage of the circuit connection layer 410 from the stress accumulation when bending is reduced. Compared to the existing manner in which the entire area to be removed is ablated when the back film portion is removed, the present disclosure only needs to cut along two straight cutting paths R, which greatly improves the cutting efficiency, and the laser ablation corresponding to the back film 300 of the entire area of the bending portion 210 of the flexible base 700 is improved to that the laser cut the two lines, which is further improved the reliability. In addition, since the groove 230 has no contact with the back film 300 or the contact area is very small, the adhesive force of the back film 300 at this position is very small, so that the tearing of the portion of the back film 300 after cutting is more convenient and easier.

Figure 16:
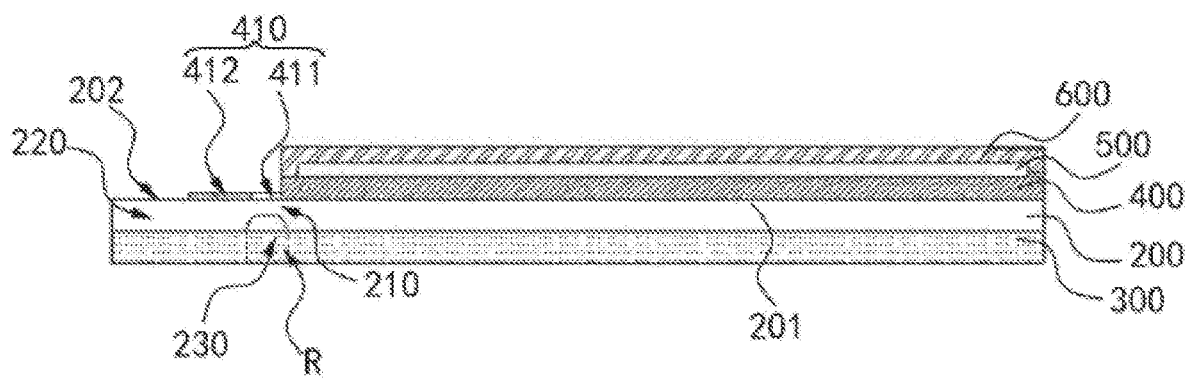
FIG. 16 is a layered view of another operation in a preparation method of a display substrate shown in FIG. 8.
Figure 17:
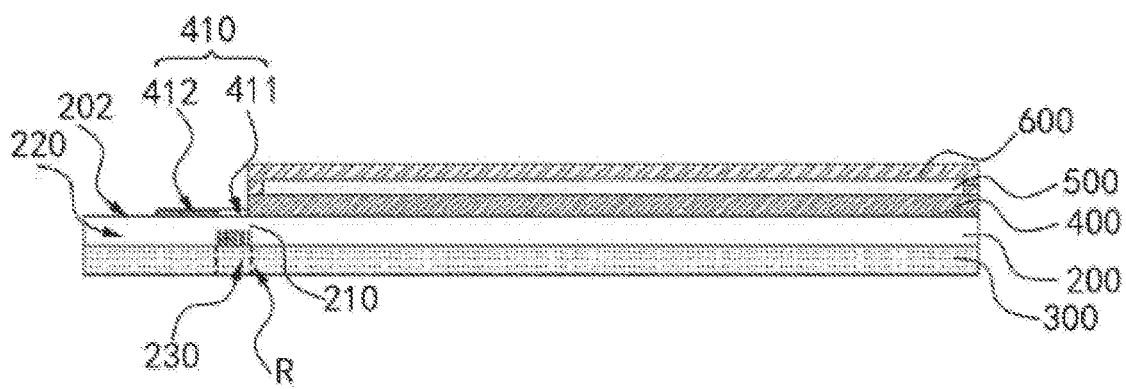
FIG. 17 is a layered view of another operation in a preparation method of a display substrate shown in FIG. 9.

As shown in FIG. 16 and FIG. 17, a process layered view in which the back film 300 is partially removed to form the through grooves 310 when the groove 230 of the flexible base 200 adopts different section to design is shown, respectively.

It should be noted here that the preparation method of the display substrate shown in the accompanying drawings and described in present specification is only a few examples of the many types of preparation methods that can adopt the principle of the present disclosure. It should be clearly understood that the principle of the present disclosure are in no way limited to any detail or any operation of the preparation method of the display substrate shown in the accompanying drawings or described in the present specification.

For example, as shown in FIG. 11, in the present arrangement, the backplane 400, the OLED light emitting device 500 and the package structure 600 are sequentially disposed on the display area 201 on the upper surface of the flexible base 200, the dispose of the back plate 400 may specifically include disposing a deposition blocking layer, an insulating layer, a gate electrode, an electrode and the like, the dispose of the OLED light emitting device 500 may specifically include evaporating a light emitting material on the back plate 400 to achieve a light emitting function, and the dispose of the package structure 600 may specifically include adopting a thin film package for the OLED light emitting device 500 to isolate water and oxygen.

In another example, the operation of separating the substrate 700 from the flexible base 200 may be performed after the operations of sequentially disposing the back plate 400, the OLED light emitting device 500 and the package structure 600 on the display area 201 of the upper surface of the flexible base 200.

For another example, in the above described preparation process proposed by the present disclosure, after the display substrate is formed, the process operations such as bonding with Pad Bending, module bonding and so on can be continuously applied, thus finally achieving the preparation of the OLED display screen product.

Based on the above described detailed description of several example arrangements of the display device proposed by the present disclosure, and based on the above described detailed description of the preparation method of the display substrate proposed by the present disclosure at the same time, a preparation method of the display device proposed by the present disclosure will be described below.

In the present arrangement, the preparation method of the display device proposed by the present disclosure mainly includes the following operations:

providing a flexible base, an upper surface thereof having a display area and a circuit connection area, and a portion of the flexible base corresponding to the circuit connection area includes a bending portion and a connecting portion;

the lower surface of the flexible base is provided with a groove, and the orthographic projection of the groove on the upper surface of the flexible base corresponds to the position of the orthographic projection of the bending portion on the upper surface of the flexible base;

the back plate, the OLED light emitting device and the package structure are sequentially disposed on the display area of the upper surface of the flexible base, and the circuit connection layer is disposed on the circuit connection area of the upper surface of the flexible base; and the bending portion of the flexible base is bent downwardly to extend, and then the connection portion is located below a portion of the flexible base corresponding to the display area.

It should be noted here that the preparation method of the display device shown in the accompanying drawings and described in present specification is only a few examples of the many types of preparation methods that can adopt the principle of the present disclosure. It should be clearly understood that the principle of the present disclosure are in no way limited to any detail or any operation of the preparation method of the display device shown in the accompanying drawings or described in the present specification.

In summary, the display substrate and the display device proposed by the present disclosure are provided with a groove at the position of the lower surface of the flexible base corresponding to the bending portion, and the back film is provided with a through groove communicating with the groove. Accordingly, in the bending process of the display substrate, the groove can help reduce the stress of the structure and making the bending process easier. Meanwhile, due to the dispose of the groove, a portion of the back film corresponding to the groove is not bonded with the lower surface of the flexible base, so that the removal of the portion of the back film is easier. Furthermore, a simpler and more accurate process, such as a laser cutting along a straight path etc., can be adopted, when the back film is removed the portion for disposing the through groove.

In detail to say, due to the dispose of the groove on the lower surface of the flexible base, so that the thickness of the bending portion of the flexible base is reduced, the bending property is improved, and the display requirement of the narrow frame is achieved. Meanwhile, since the mutual against force of the contact between the back film and the flexible base is reduced, the stress concentration problem of the relevant structure position is alleviated. When the flexible base is in contact with the backing film, the space is larger, there is no large against force, and the space for contact is released.

The example arrangements of the display substrate and the preparation method thereof, the display device and the preparation method thereof and display apparatus proposed by the present disclosure are described and/or shown in detail above. However, the arrangements of the present disclosure are not limited to the specific arrangements described here, but rather, the components and/or operations of each arrangement can be used independently and separately from the other components and/or operations described here. Each component and/or each operation of one arrangement may also be used in combination with other components and/or operations of other arrangement. When introducing elements/components/etc. described and/or shown here, the terms "one", "a/an" and "above described" are used to denote the presence of one or more elements/components/etc. The terms "containing", "including" and "having" are used to denote the meaning of open inclusion and refer to the existence of additional elements/components/etc. in addition to the listed elements/components/etc.

Although the display substrate and the preparation method thereof, the display device and the preparation method thereof and the display apparatus proposed by the present disclosure have been described according to different specific arrangements, but it will be appreciated by those skilled in the art that modifications may be made in the implement of the disclosure within the spirit and scope of the claims.

What is claimed is:

1. A display substrate, comprising:
   a flexible base, wherein:
   an upper surface of the flexible base is provided with a display area and a circuit connection area, and a lower surface of the flexible base is provided with a back film;
   a portion of the flexible base corresponding to the circuit connection area comprises a bending portion and a connection portion;
   the lower surface of the flexible base is provided with a groove;
   an orthographic projection of the groove on the upper surface of the flexible base corresponds to a position of an orthographic projection of the bending portion on the upper surface of the flexible base;
   the circuit connection area of the upper surface of the flexible base is provided with a circuit connection layer, the circuit connection layer comprising a circuit bending portion and a circuit connection portion;
   an orthographic projection of the circuit bending portion on the upper surface of the flexible base corresponds to the position of the orthographic projection of the bending portion on the upper surface of the flexible base; and
   the circuit bending portion of the circuit connection layer is bent downward to extend together with the bending portion during the bending process of the flexible base, the circuit connection portion of the circuit connection layer being located on the lower surface side of the flexible base together with the connection portion after a bend in the flexible base.

2. The display substrate according to claim 1, wherein a portion of the groove is in a shape of rectangle or trapezoid.

3. The display substrate according to claim 1, wherein the groove comprises a plurality of sub-grooves, the plurality of sub-grooves being disposed in parallel and at an interval, and a portion of the groove being in a shape of grid.

4. The display substrate according to claim 1, wherein a groove depth of the groove is one third to one half of a thickness of the flexible base.

5. The display substrate according to claim 1, wherein a width of a notch of the groove is in a range of 0.8 mm to 1.2 mm.

6. The display substrate according to claim 1, wherein the back film is provided with a through groove, an orthographic projection of the through groove on the upper surface of the flexible base corresponding to a position of an orthographic projection of the groove on the upper surface of the flexible base.

7. A display device, comprising:
   a display substrate, comprising a flexible base, wherein:
   an upper surface of the flexible base is provided with a display area and a circuit connection area;
   a lower surface of the flexible base is provided with a back film;
   a portion of the flexible base corresponding to the circuit connection area comprising a bending portion and a connection portion;
   the lower surface of the flexible base is provided with a groove;
   an orthographic projection of the groove on the upper surface of the flexible base corresponds to a position of an orthographic projection of the bending portion on the upper surface of the flexible base;
   the bending portion of the flexible base is bent downwardly to extend;
   the connection portion is located below a portion of the flexible base corresponding to the display area;
   the circuit connection area of the upper surface of the flexible base is provided with a circuit connection layer having a circuit bending portion and a circuit connection portion;
   an orthographic projection of the circuit bending portion on the upper surface of the flexible base corresponds to the position of the orthographic projection of the bending portion on the upper surface of the flexible base; and
   the circuit bending portion of the circuit connection layer is bent downward to extend together with the bending portion during the bending process of the flexible base, the circuit connection portion of the circuit connection layer being located on the lower surface side of the flexible base together with the connection portion after a bend in the flexible base.

8. The display device according to claim 7, wherein the groove comprises a plurality of sub-grooves, and the plurality of sub-grooves are disposed in parallel and at an interval, and a portion of the groove is in a shape of a grid.

9. The display device according to claim 7, wherein a groove depth of the groove is one third to one half of a thickness of the flexible base.

10. The display device according to claim 7, wherein:
the circuit connection area of the upper surface of the flexible base is provided with a circuit connection layer;
the circuit connection layer comprises a circuit bending portion and a circuit connection portion, an orthographic projection of the circuit bending portion on the upper surface of the flexible base corresponding to a position of an orthographic projection of the bending portion on the upper surface of the flexible base; and
the circuit bending portion is bent downwardly to extend.

11. The display device according to claim 7, wherein the back film is provided with a through groove, an orthographic projection of the through groove on the upper surface of the flexible base corresponding to a position of an orthographic projection of the groove on the upper surface of the flexible base.

12. The display device according to claim 7, wherein the display device is implemented in a display apparatus.

13. A preparation method of a display substrate, comprising:
providing a flexible base, an upper surface thereof being provided with a display area and a circuit connection area, and a portion of the flexible base corresponding to the circuit connection area comprising a bending portion and a connecting portion;
disposing a groove at a lower surface of the flexible base, and an orthographic projection of the groove on the upper surface of the flexible base corresponding to a position of an orthographic projection of the bending portion on the upper surface of the flexible base, wherein the circuit connection area of the upper surface of the flexible base is provided with a circuit connection layer, the circuit connection layer comprises a circuit bending portion and a circuit connection portion, and an orthographic projection of the circuit bending portion on the upper surface of the flexible base corresponds to the position of the orthographic projection of the bending portion on the upper surface of the flexible base;
disposing a back plate, an organic light-emitting diode (OLED) device and a package structure in a sequence on the display area of the upper surface of the flexible base, and disposing a circuit connection layer on the circuit connection area of the upper surface of the flexible base; and
bending the bending portion of the flexible base downward to extend, the connection portion being located on a side of the lower surface of the flexible base, wherein the circuit bending portion of the circuit connection layer is bent downward to extend together with the bending portion during the bending process of the flexible base, the circuit connection portion of the circuit connection layer being located on the lower surface side of the flexible base together with the connection portion after the flexible base is bent.

14. The preparation method of the display substrate according to claim 13, wherein providing a flexible base further comprises:
providing a substrate;
disposing a convex structure on the upper surface of the substrate;
coating on the upper surface of the substrate to form the flexible base, and a position of the lower surface of the flexible base corresponding to the convex structure forming the groove; and
separating the substrate from the flexible base.

15. The preparation method of the display substrate according to claim 13, wherein providing a flexible base further comprises:
providing a substrate;
disposing a limiting convex structure at a corner portion of the upper surface of the substrate;
coating on the upper surface of the substrate to form the flexible base; and
cutting to separate the substrate from the flexible base, and the limiting convex structure being configured to limit an amount of feed of a cutting during a separation process.

16. The preparation method of the display substrate according to claim 13, wherein providing a flexible base further comprises:
providing a substrate;
disposing a convex structure on the upper surface of the substrate;
disposing a limiting convex structure at a corner portion of the upper surface of the substrate;
coating on the upper surface of the substrate to form the flexible base, and a position of the lower surface of the flexible base corresponding to the convex structure forming the groove; and
cutting to separate the substrate from the flexible base, and the limiting convex structure being configured to limit an amount of feed of a cutting during the separation.

17. The preparation method of the display substrate according to claim 13, further comprising:
disposing a back film on the lower surface of the flexible base; and
disposing a through groove in the back film, an orthographic projection of the through groove on the upper surface of the flexible base corresponding to a position of the orthographic projection of the groove on the upper surface of the flexible base.

18. The preparation method of the display substrate according to claim 17, wherein using laser to cut the through groove along two straight cutting paths on the back film, and the two straight cutting paths corresponding to groove walls at both sides of the groove, respectively.

19. The preparation method of the display substrate according to claim 13, further comprising implementing the display substrate in a display device.

* * * * *